(12) United States Patent
Abrams et al.

(10) Patent No.: US 8,056,021 B2
(45) Date of Patent: *Nov. 8, 2011

(54) METHOD FOR TIME-EVOLVING RECTILINEAR CONTOURS REPRESENTING PHOTO MASKS

(75) Inventors: Daniel Abrams, Mountain View, CA (US); Danping Peng, Fremont, CA (US); Stanley Osher, Pacific Palisades, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/794,626

(22) Filed: Jun. 4, 2010

(65) Prior Publication Data

US 2010/0275175 A1 Oct. 28, 2010

Related U.S. Application Data

(60) Division of application No. 11/674,133, filed on Feb. 12, 2007, now Pat. No. 7,757,201, which is a continuation of application No. 11/209,268, filed on Aug. 22, 2005, now Pat. No. 7,178,127, which is a continuation of application No. 10/408,928, filed on Apr. 6, 2003, now Pat. No. 7,124,394.

(51) Int. Cl.
*G06F 17/50* (2006.01)
(52) U.S. Cl. .......................................... 716/50; 716/55
(58) Field of Classification Search ........ 703/2; 716/50, 716/55
See application file for complete search history.

(56) References Cited

U.S. PATENT DOCUMENTS

| | | | |
|---|---|---|---|
| 4,752,957 A | 6/1988 | Maeda | |
| 5,242,770 A | 9/1993 | Chen et al. | |
| 5,301,101 A | 4/1994 | MacArthur et al. | |
| 5,418,092 A | 5/1995 | Okamoto | |
| 5,489,509 A | 2/1996 | Kawabata et al. | |
| 5,508,803 A | 4/1996 | Hibbs et al. | |
| 5,525,808 A * | 6/1996 | Irie et al. ...................... | 250/548 |
| 5,546,189 A * | 8/1996 | Svetkoff et al. ............... | 356/602 |
| 5,546,225 A | 8/1996 | Shiraishi | |
| 5,640,199 A | 6/1997 | Garakani et al. | |
| 5,707,765 A * | 1/1998 | Chen ................................. | 430/5 |
| 5,889,678 A | 3/1999 | Inoue et al. | |

(Continued)

FOREIGN PATENT DOCUMENTS

WO WO 2007/033362 A2 3/2007

(Continued)

OTHER PUBLICATIONS

A. Rosenbluth et. al, "Optimum mask and source patterns to print a given shape", $JM^3$ vol. 1 No. 1 pp. 13-30 (2002).

(Continued)

*Primary Examiner* — Stacy Whitmore
(74) *Attorney, Agent, or Firm* — Wilson Sonsini Goodrich & Rosati

(57) ABSTRACT

Photomask patterns are represented using contours defined by level-set functions. Given target pattern, contours are optimized such that defined photomask, when used in photolithographic process, prints wafer pattern faithful to target pattern. Optimization utilizes "merit function" for encoding aspects of photolithographic process, preferences relating to resulting pattern (e.g. restriction to rectilinear patterns), robustness against process variations, as well as restrictions imposed relating to practical and economic manufacturability of photomasks.

21 Claims, 12 Drawing Sheets

Wafer pattern 604

U.S. PATENT DOCUMENTS

| | | | |
|---|---|---|---|
| 6,022,644 A * | 2/2000 | Lin et al. ............................ 430/5 |
| 6,042,998 A | 3/2000 | Brueck et al. |
| 6,096,567 A * | 8/2000 | Kaplan et al. .................... 438/14 |
| 6,123,733 A | 9/2000 | Dalton |
| 6,383,847 B1 | 5/2002 | Ditlow et al. |
| 6,468,711 B1 | 10/2002 | Sorori et al. |
| 6,484,306 B1 | 11/2002 | Bokor et al. |
| 6,563,566 B2 * | 5/2003 | Rosenbluth et al. ............ 355/67 |
| 6,596,466 B1 | 7/2003 | Pohland et al. |
| 6,601,192 B1 * | 7/2003 | Bowman-Amuah ............ 714/38 |
| 6,611,627 B1 * | 8/2003 | LaRossa et al. ............. 382/240 |
| 6,617,096 B2 | 9/2003 | Burkhard |
| 6,677,948 B1 | 1/2004 | Wasserman et al. |
| 6,698,007 B2 * | 2/2004 | Wu et al. ......................... 716/52 |
| 6,703,170 B1 | 3/2004 | Pindo |
| 6,704,920 B2 * | 3/2004 | Brill et al. ....................... 716/53 |
| 6,718,291 B1 * | 4/2004 | Shapiro et al. .................... 703/2 |
| 6,733,929 B2 | 5/2004 | Pierrat |
| 6,756,980 B2 | 6/2004 | Hayashi |
| 6,764,795 B2 | 7/2004 | Aton et al. |
| 6,787,271 B2 | 9/2004 | Cote |
| 6,795,069 B2 * | 9/2004 | Raskar et al. ................. 345/419 |
| 6,798,412 B2 * | 9/2004 | Cowperthwaite ............. 345/428 |
| 6,799,313 B2 | 9/2004 | LaCour |
| 6,809,797 B2 * | 10/2004 | Baselmans et al. ............. 355/52 |
| 6,880,135 B2 | 4/2005 | Chang et al. |
| 6,968,532 B2 | 11/2005 | Sivakumar et al. |
| 7,027,658 B2 | 4/2006 | Osher et al. |
| 7,031,538 B2 | 4/2006 | Osher et al. |
| 7,073,162 B2 | 7/2006 | Cobb et al. |
| 7,124,394 B1 | 10/2006 | Abrams et al. |
| 7,175,945 B2 | 2/2007 | Mieher et al. |
| 7,178,127 B2 | 2/2007 | Abrams et al. |
| 7,231,628 B2 | 6/2007 | Pack et al. |
| 7,236,123 B2 | 6/2007 | Siegel |
| 7,302,090 B2 | 11/2007 | Kalus et al. |
| 7,353,145 B2 | 4/2008 | Tanaka et al. |
| 7,403,641 B2 | 7/2008 | Nakamoto et al. |
| 7,441,227 B2 | 10/2008 | Abrams et al. |
| 7,480,889 B2 * | 1/2009 | Abrams et al. ................. 716/54 |
| 7,496,880 B2 * | 2/2009 | Melvin et al. .................... 716/51 |
| 7,512,927 B2 | 3/2009 | Gallatin et al. |
| 7,571,423 B2 | 8/2009 | Abrams et al. |
| 7,698,665 B2 | 4/2010 | Abrams et al. |
| 7,703,068 B2 | 4/2010 | Abrams et al. |
| 7,707,541 B2 | 4/2010 | Abrams et al. |
| 7,757,201 B2 | 7/2010 | Abrams et al. |
| 2002/0028393 A1 | 3/2002 | Laidig et al. |
| 2002/0066069 A1 | 5/2002 | Ashida et al. |
| 2002/0177050 A1 | 11/2002 | Tanaka |
| 2002/0188924 A1 | 12/2002 | Pierrat et al. |
| 2003/0016864 A1 | 1/2003 | McGee et al. |
| 2003/0095267 A1 | 5/2003 | Mieher et al. |
| 2003/0103189 A1 | 6/2003 | Neureuther et al. |
| 2003/0106642 A1 | 6/2003 | Fairbairn |
| 2003/0123707 A1 * | 7/2003 | Park ................................ 382/106 |
| 2003/0140330 A1 | 7/2003 | Tanaka et al. |
| 2003/0152841 A1 * | 8/2003 | Averbukh .......................... 430/1 |
| 2003/0165749 A1 | 9/2003 | Fritze et al. |
| 2003/0198872 A1 * | 10/2003 | Yamazoe et al. ................... 430/5 |
| 2004/0008880 A1 | 1/2004 | Horie et al. |
| 2004/0021660 A1 | 2/2004 | Ng-Thow-Hing et al. |
| 2004/0031013 A1 | 2/2004 | Dulman et al. |
| 2004/0073884 A1 | 4/2004 | Kroyan |
| 2004/0086792 A1 | 5/2004 | Romeo et al. |
| 2004/0101766 A1 * | 5/2004 | Mesuda et al. ..................... 430/5 |
| 2004/0136587 A1 * | 7/2004 | Kalus et al. ................... 382/145 |
| 2004/0147121 A1 * | 7/2004 | Nakagaki et al. ............. 438/689 |
| 2004/0161678 A1 | 8/2004 | Misaka |
| 2004/0166422 A1 * | 8/2004 | Yamazoe et al. ................... 430/5 |
| 2004/0214096 A1 | 10/2004 | Dulman et al. |
| 2004/0229133 A1 * | 11/2004 | Socha et al. ........................ 430/5 |
| 2004/0265707 A1 * | 12/2004 | Socha ................................ 430/5 |
| 2005/0066300 A1 | 3/2005 | Zach |
| 2005/0122500 A1 | 6/2005 | Ye et al. |
| 2005/0136340 A1 * | 6/2005 | Baselmans et al. ................. 430/5 |
| 2005/0142470 A1 * | 6/2005 | Socha et al. ..................... 430/30 |
| 2005/0147893 A1 * | 7/2005 | Ogawa et al. ..................... 430/5 |
| 2005/0191566 A1 | 9/2005 | Liu et al. |
| 2005/0251771 A1 | 11/2005 | Robles |
| 2005/0265605 A1 | 12/2005 | Nakamoto et al. |
| 2006/0049978 A1 | 3/2006 | Siegel |
| 2006/0051682 A1 | 3/2006 | Hess et al. |
| 2006/0273242 A1 | 12/2006 | Hunsche et al. |
| 2007/0133862 A1 | 6/2007 | Gold et al. |
| 2010/0251203 A1 | 9/2010 | Abrams et al. |
| 2010/0275176 A1 | 10/2010 | Abrams et al. |

FOREIGN PATENT DOCUMENTS

| | | |
|---|---|---|
| WO | WO 2007/033362 A3 | 3/2007 |
| WO | WO 2007/044630 A2 | 4/2007 |
| WO | WO 2007/044630 A3 | 4/2007 |

OTHER PUBLICATIONS

B.E.A. Saleh and S.I. Sayegh, "Reductions of errors of microphotographic reproductions by optical corrections of original masks", Optical Eng. vol. 20, No. 5 pp. 781-784 (1981).

Chen, C. Y. et al, "Mask defect auto disposition based on aerial image in mask product", Proc. SPIE 7379, 73791F (2009).

Erdmann et al., Enhancements in Rigorous Simulation of Light Diffraction from Phase Shaft Masks, Mar. 2002, SPIE, vol. 4691, pp. 1156-1167.

Gordon et al., Lithography simulation employing rigorous solution of Maxwell's equations, Feb. 1998, SPIE, vol. 3334, pp. 176-196.

J.A. Sethian and D. Adalsteinsson, "An overview of level set methods for etching, deposition, and lithography development", IEEE Trans. on Semiconductor Manufacturing, vol. 10, No. 1, pp. 167-184, Feb. 1997.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

J.M. Berg and N. Zhou, "Shape-based optimization of a plasma etching process", $39^{th}$ IEEE Conf. on Decision and Control, pp. 2023-2028 (Dec. 2000).

J.M. Geremia and H. Rabitz, "Optimal Hamiltonian identification: the synthesis of quantum optimal control and quantum inversion", J. Chem. Physics, vol. 118, No. 12 pp. 5369-5382 (Mar. 2003).

K.M. Nashold and B.E.A. Saleh, "Image construction through diffraction-limited high-contrast imaging systems: an iterative approach", J. Opt. Soc. Am.A, vol. 2, No. 5 pp. 635-643 (1985).

Khan, M. et al, "A Semi-Empirical Resist Dissolution Model for Sub-micron Lithographies", pp. 41-46, by Technical Proceedings of the 1998 International Conference on Modeling and Simulation of Microsystems, 1998.

Nicolas Bailey Cobb, PhD Thesis, "Fast Optical and Process Proximity Correction Algorithms for Integrated Circuit Manufacturing", U.C. Berkeley, Spring 1998.

S. Osher and R. P. Fedkiw, "Level set methods: an overview and some recent results", J. Computational Physics, vol. 169, No. 2, pp. 463 May 20, 2001.

Sethian, J.A., "Level set methods and fast marching methods," 1999, Cambridge University Press, pp. 1-33.

Sethian, J.A., "Level set methods and fast marching methods," 1999, Cambridge University Press, pp. 316-360 (printed from website http://math.berkeley.edu/~sethian/level_set.html).

Wong et al., Massively Parallel Electromagnetic Simulation for Photolithographic Applications, Oct. 1995, IEEE, vol. 14, pp. 1231-1240.

Y. Liu and A. Zakhor, "Binary and phase-shifting image design for optical lithography", Proc. SPIE vol. 1463 pp. 382-399 (1991).

Y. Liu and A. Zakhor, "Optimal binary image design for optical lithography", Proc. SPIE vol. 1264 pp. 401-412 (1990).

Y.H. Oh, and J-C Lee, "Resolution enhancement through optical proximity correction and stepper parameter optimization for 0.12-urn mask pattern", Proc. SPIE vol. 3679 pp. 607-613 (1999).

Y-T Wang, Y.C. Pati, H. Watanabe and T. Kailath, "Automated design of halftoned double-exposure phase-shifting masks", Proc. SPIE vol. 2440 pp. 290-301 (1995).

Abrams, S. et al., "Method for Time-Evolving Rectilinear Contours Representing Photo Masks," U.S. Appl. No. 12/794,614, filed Jun. 4, 2010, Notice of Allowance mailed Nov. 30, 2010.

Amendment and Response, filed Aug. 12, 2005, in Abrams, Daniel S., et al., U.S. Appl. No. 10/408,928, "Method for Time-Evolving Rectilinear Contours Representing Photo Masks," filed Apr. 6, 2003, issued as U.S. Patent No. 7,124,394 on Oct. 17, 2006.

Office Action issued by U.S. Patent and Trademark Office, dated Feb. 14, 2005, in Abrams, Daniel et al., U.S. Appl. No. 10/408,928, "Method for Time-Evolving Rectilinear Contours Representing Photo Masks," filed Apr. 6, 2003, issued as U.S. Patent No. 7,124,394 on Oct. 17, 2006.

Office Action issued by U.S. Patent and Trademark Office, mailed Mar. 8, 2005, in Abrams, Daniel S., et al., U.S. Appl. No. 10/408,924, "Optimized Photomasks for Photolithography," filed Apr. 6, 2003, now issued as U.S. Patent 7,480,889.

Reply to Office Action, mailed Sep. 8, 2005, in Abrams, Daniel S., et al., U.S. Appl. No. 10/408,924, "Optimized Photomasks for Photolithography," filed Apr. 6, 2003, now issued as U.S. Patent 7,480,889.

Office Action issued by U.S. Patent and Trademark Office, mailed Nov. 18, 2005, in Abrams, Daniel S., et al., U.S. Appl. No. 10/408,924, "Optimized Photomasks for Photolithography," filed Apr. 6, 2003, now issued as U.S. Patent 7,480,889.

Reply to Office Action, mailed May 18, 2006, in Abrams, Daniel S., et al., U.S. Appl. No. 10/408,924, "Optimized Photomasks for Photolithography," filed Apr. 6, 2003, now issued as U.S. Patent 7,480,889.

Office Action issued by U.S. Patent and Trademark Office, mailed Jul. 14, 2006, in Abrams, Daniel S., et al., U.S. Appl. No. 10/408,924, "Optimized Photomasks for Photolithography," filed Apr. 6, 2003, now issued as U.S. Patent 7,480,889.

Reply to Office Action, mailed Jan. 16, 2007, in Abrams, Daniel S., et al., U.S. Appl. No. 10/408,924, "Optimized Photomasks for Photolithography," filed Apr. 6, 2003, now issued as U.S. Patent 7,480,889.

Office Action issued by U.S. Patent and Trademark Office, mailed Jun. 20, 2007, in Abrams, Daniel S., et al., U.S. Appl. No. 10/408,924, "Optimized Photomasks for Photolithography," filed Apr. 6, 2003, now issued as U.S. Patent 7,480,889.

Response, mailed Dec. 17, 2007, in Abrams, Daniel S., et al., U.S. Appl. No. 10/408,924, "Optimized Photomasks for Photolithography," filed Apr. 6, 2003, now issued as U.S. Patent 7,480,889.

Abrams, Daniel S., et al., "Optimized Photomasks for Photolithography," Final Office Action mailed Mar. 20, 2008, in U.S. Appl. No. 10/408,924, filed Apr. 6, 2003, now issued as U.S. Patent 7,480,889.

RCE and Reply to Office Action, mailed Jul. 18, 2008, in Abrams, Daniel S., et al., U.S. Appl. No. 10/408,924, "Optimized Photomasks for Photolithography," filed Apr. 6, 2003, now issued as U.S. Patent 7,480,889.

Abrams, Daniel et al., "Optimized Photomasks for Photolithography," Nonfinal Office Action mailed Apr. 21, 2008, in U.S. Appl. No. 11/225,378, filed Sep. 12, 2005, issued as U.S. Patent 7,571,423.

Abrams, Daniel et al., "Optimized Photomasks for Photolithography," Response mailed Sep. 22, 2008, in U.S. Appl. No. 11/225,378, filed Sep. 12, 2005, issued as U.S. Patent 7,571,423.

Abrams, Daniel et al., "Systems, Masks, and Methods for Manufacturable Masks," Nonfinal Office Action mailed Apr. 2, 2009, in U.S. Appl. No. 11/245,691, filed Oct. 6, 2005.

Abrams, Daniel et al., "Systems, Masks, and Methods for Manufacturable Masks," Response to Office Action filed Jul. 29, 2009, in U.S. Appl. No. 11/245,691, filed Oct, 6, 2005.

Abrams, Daniel S., et al., "Systems, Masks, and Methods for Photolithography," Nonfinal Office Action mailed Mar. 19, 2009, in U.S. Appl. No. 11/531,673, filed Sep. 13, 2005.

Abrams, Daniel S., et al., "Systems, Masks, and Methods for Photolithography," Response to Nonfinal Office Action filed Aug. 13, 2009, in U,S. Appl. No. 11/531,673, filed Sep. 13, 2005.

Office Action issued by U.S. Patent and Trademark Office, mailed Sep. 25, 2007, in Abrams, Daniel S., et al., U.S. Appl. No. 11/549,846, "Method for Time-Evolving Rectilinear Contours Representing Photo Masks," filed Oct. 16, 2006, now issued as U.S. Patent 7,441,227.

Response mailed Feb. 22, 2008, in Abrams, Daniel S., et al., U.S. Appl. No. 11/549,846, "Method for Time-Evolving Rectilinear Contours Representing Photo Masks," filed Oct. 16, 2006, now issued as U.S. Patent 7,441,227.

Abrams, Daniel et al., "Technique for Determining a Mask Pattern Corresponding to a Photomask," Nonfinal Office Action mailed May 28, 2009, in U.S. Appl. No. 11/674,130, filed Feb. 12, 2007.

Abrams, Daniel et al., "Technique for Determining a Mask Pattern Corresponding to a Photomask," Response mailed Aug. 27, 2009, in U.S. Appl. No. 11/674,130, filed Feb. 12, 2007.

Abrams, Daniel et al., "Method for Time-Evolving Rectilinear Contours Representing Photo Masks," Response to Nonfinal Office Action dated Jan. 7, 2010, in U.S. Appl. No. 11/674,133, filed Feb. 12, 2007.

Abrams, Daniel et al., "Method for Time-Evolving Rectilinear Contours Representing Photo Masks," Office Action mailed Nov. 23, 2009, in U.S. Appl. No. 11/674,133, filed Feb. 12, 2007.

Abrams, S. et al., "Method for Time-Evolving Rectilinear Contours Representing Photo Masks," U.S. Appl. No. 12/794,597, filed Jun. 4, 2010, Notice of Allowance mailed Nov. 17, 2010.

Abrams, S. et al., "Method for Time-Evolving Rectilinear Contours Representing Photo Masks," U.S. Appl. No. 12/794,614, filed Jun. 4, 2010, Notice of Allowance mailed Nov. 30, 2010.

* cited by examiner

Wafer pattern 604

US 8,056,021 B2

METHOD FOR TIME-EVOLVING RECTILINEAR CONTOURS REPRESENTING PHOTO MASKS

CROSS REFERENCE

This application is a divisional patent application of U.S. patent application Ser. No. 11/674,133, filed Feb. 12, 2007 now U.S. Pat. No. 7,757,201, which is a continuation patent application of U.S. patent application Ser. No. 11/209,268, filed Aug. 22, 2005, now U.S. Pat. No. 7,178,127 issued on Feb. 13, 2007, which is a continuation patent application of U.S. patent application Ser. No. 10/408,928, filed Apr. 6, 2003, now U.S. Pat. No. 7,124,394 issued on Oct. 17, 2006, which are incorporated herein by reference in their entirety and to which applications we claim priority under 35 U.S.C. §120.

This application is related to copending U.S. patent application Ser. Nos. 12/794,597 and 12/794,614, filed Jun. 4, 2010, each a divisional of U.S. patent application Ser. No. 11/674,133, filed Feb. 12, 2007. This application is further related to U.S. Ser. No. 11/549,846 filed Oct. 16, 2006, now U.S. Pat. No. 7,441,227 issued on Oct. 21, 2008; U.S. patent application Ser. No. 11/674,130, filed Feb. 12, 2007, now U.S. Pat. No. 7,703,068 issued Apr. 20, 2010; and U.S. patent application Ser. No. 11/245,691 filed Oct. 6, 2005, now U.S. Pat. No. 7,698,665 issued Apr. 13, 2010, which claims priority to U.S. patent application Ser. No. 10/408,928, filed Apr. 6, 2003, now U.S. Pat. No. 7,124,394 issued on Oct. 17, 2006 and U.S. patent application Ser. No. 10/408,924, filed Apr. 6, 2003, now U.S. Pat. No. 7,408,889 issued on Jan. 20, 2009, which are incorporated herein by reference in their entirety.

BACKGROUND INFORMATION

1. Field of Invention

Invention relates to masks, also known as photomasks, used in photolithography processes and, more particularly, to a method for applying level-set technology to time-evolve contours representing patterns on photomasks in such a way so as to allow for production of wafer patterns with minimal distortions or artifacts and to allow for the ability to constrain resulting contours to rectilinear patterns.

2. Description of Related Art

Lithography processing represents an essential technology for manufacturing Integrated Circuits (IC) and Micro Electro-Mechanical Systems (MEMS). Lithographic techniques are used to define patterns, geometries, features, shapes, et al ("patterns") onto an integrated circuit die or semiconductor wafer or chips where the patterns are typically defined by a set of contours, lines, boundaries, edges, curves, et al ("contours"), which generally surround, enclose, and/or define the boundary of the various regions which constitute a pattern.

Demand for increased density of features on dies and wafers has resulted in the design of circuits with decreasing minimum dimensions. However, due to the wave nature of light, as dimensions approach sizes comparable to the wavelength of the light used in the photolithography process, the resulting wafer patterns deviate from the corresponding photomask patterns and are accompanied by unwanted distortions and artifacts.

Techniques such as Optical Proximity Correction (OPC) attempt to solve this problem by appropriate pre-distortion of the photomask pattern. However, such approaches do not consider the full spectrum of possible photomask patterns, and therefore result in sub-optimal designs. The resulting patterns may not print correctly at all, or may not print robustly. Accordingly, there is a need for a method for generating the optimal photomask patterns which result in the robust production of wafer patterns faithful to their target patterns.

SUMMARY OF INVENTION

Photomask patterns are represented using contours defined by level-set functions. Given target pattern, contours are optimized such that defined photomask, when used in photolithographic process, prints wafer pattern faithful to target pattern.

Optimization utilizes "merit function" for encoding aspects of photolithographic process, preferences relating to resulting pattern (e.g. restriction to rectilinear patterns), robustness against process variations, as well as restrictions imposed relating to practical and economic manufacturability of photomasks.

DETAILED DESCRIPTION OF PREFERRED EMBODIMENT(S)

As understood herein, the term "wafer pattern" is understood to include any polygon (rectilinear or non-rectilinear)

or other shape or pattern to be formed on a semiconductor or other material substrate, for example digital or analog circuit structures or interconnect.

Figure 1:
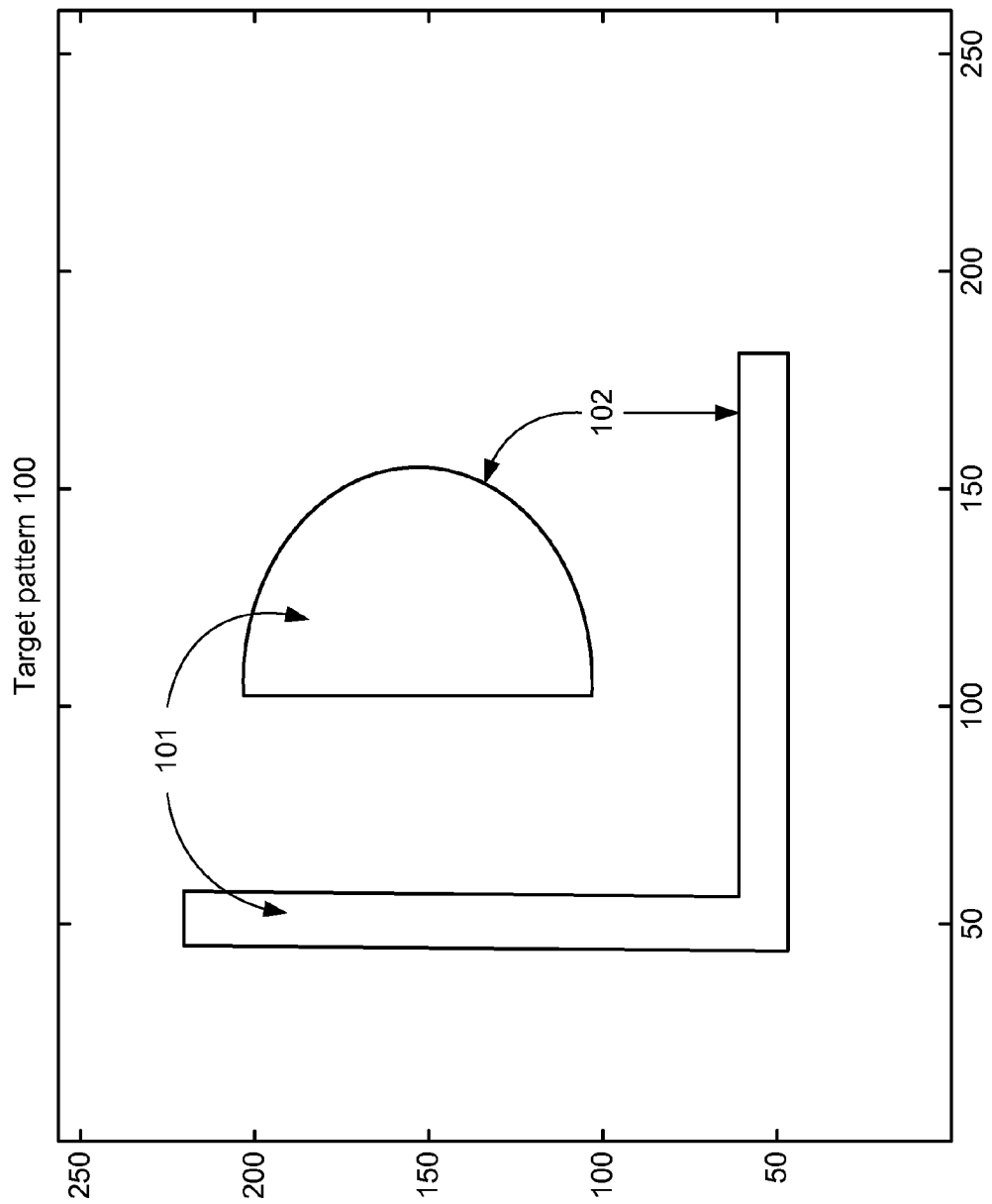
FIG. 1 is a diagram illustrating a simple example target pattern to be printed on a wafer using a photolithography process, according to an embodiment of the present invention.

FIG. 1 is a diagram illustrating an example target pattern 100 to be printed on a wafer using a photolithography process. Target pattern 100 comprises regions 101 enclosed by contours 102. Preferably, areas within regions 101 represent photoresist and the area outside regions 101 represents the absence of photoresist.

Figure 2:
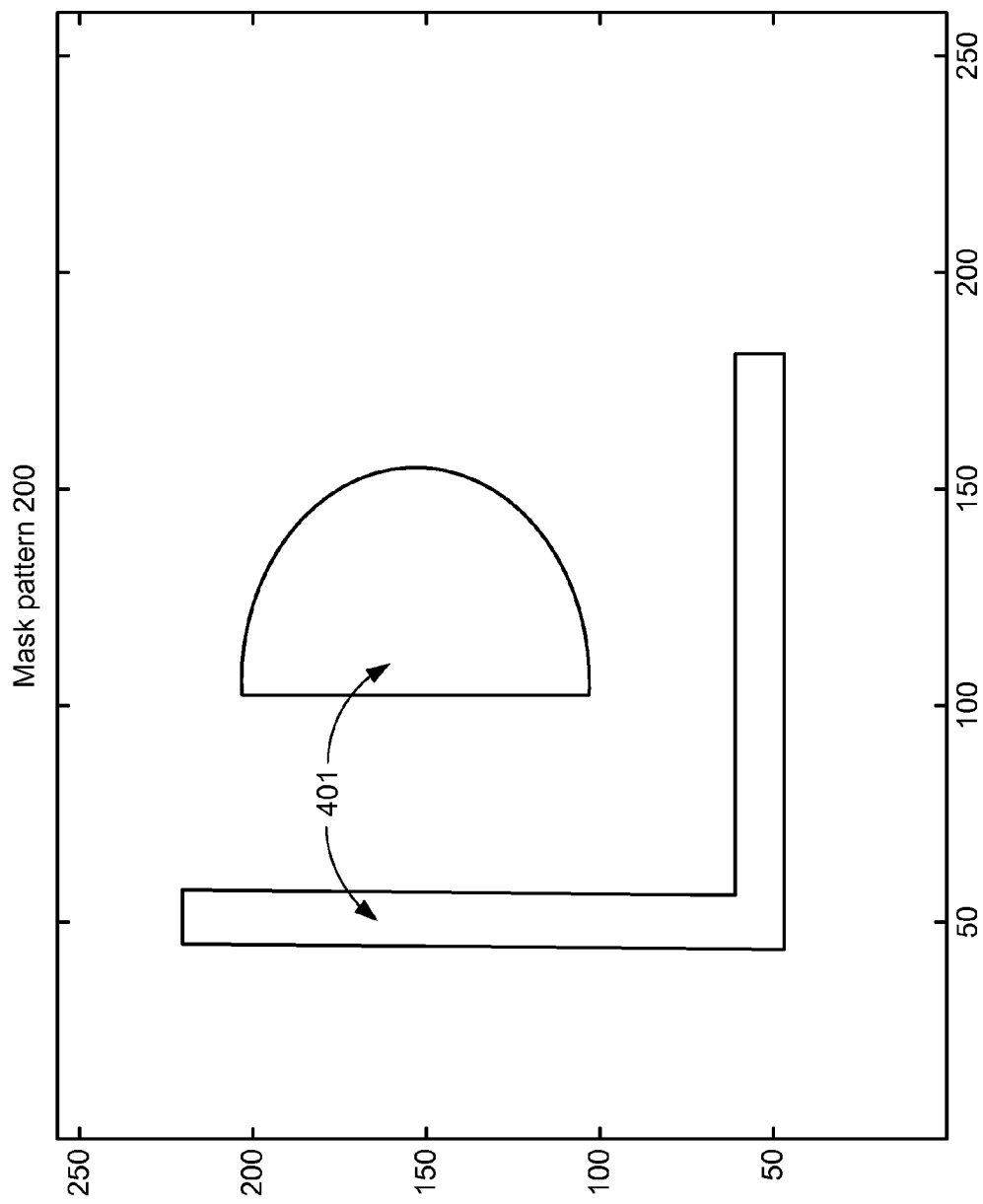
FIG. 2 is a diagram illustrating an example photomask pattern in the (x,y) plane comprising regions, according to a preferred embodiment of the present invention.

FIG. 2 is a diagram illustrating an example photomask pattern 201 in the (x,y) plane comprising regions 201 for printing a wafer pattern in a photolithography process. In a preferred embodiment, an area within a region 201 represents chrome and the area outside regions 201 represents glass on the photomask. Alternatively, an area within a region 201 represents a material other than chrome and the area outside regions 201 represents a material other than glass on the photomask.

Figure 3:
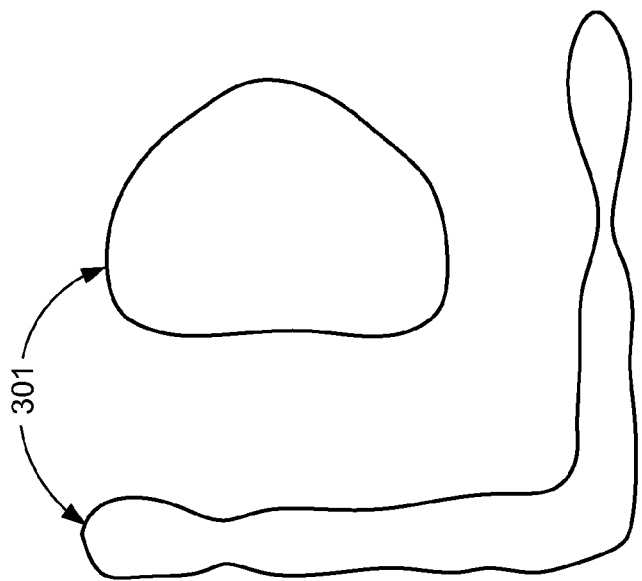
FIG. 3 is a diagram showing an example wafer pattern illustrative of what might print on a wafer using the example photomask pattern of FIG. 2 in a photolithography process, according to an embodiment of the present invention.

FIG. 3 is a diagram showing an example wafer pattern 300 illustrative of what might print on a wafer using photomask pattern 200 in a photolithography process. Preferably, areas within regions 301 represent photoresist and the area outside regions 301 represents the absence of photoresist. Note that wafer pattern 300 differs from target pattern 100 due to distortions and artifacts produced by the photolithography process. It is an object of the present invention to generate a photomask pattern which, when used in a photolithography process, produces a wafer pattern more faithful to the corresponding target pattern, the wafer pattern having fewer undesirable distortions and artifacts.

Figure 4A:
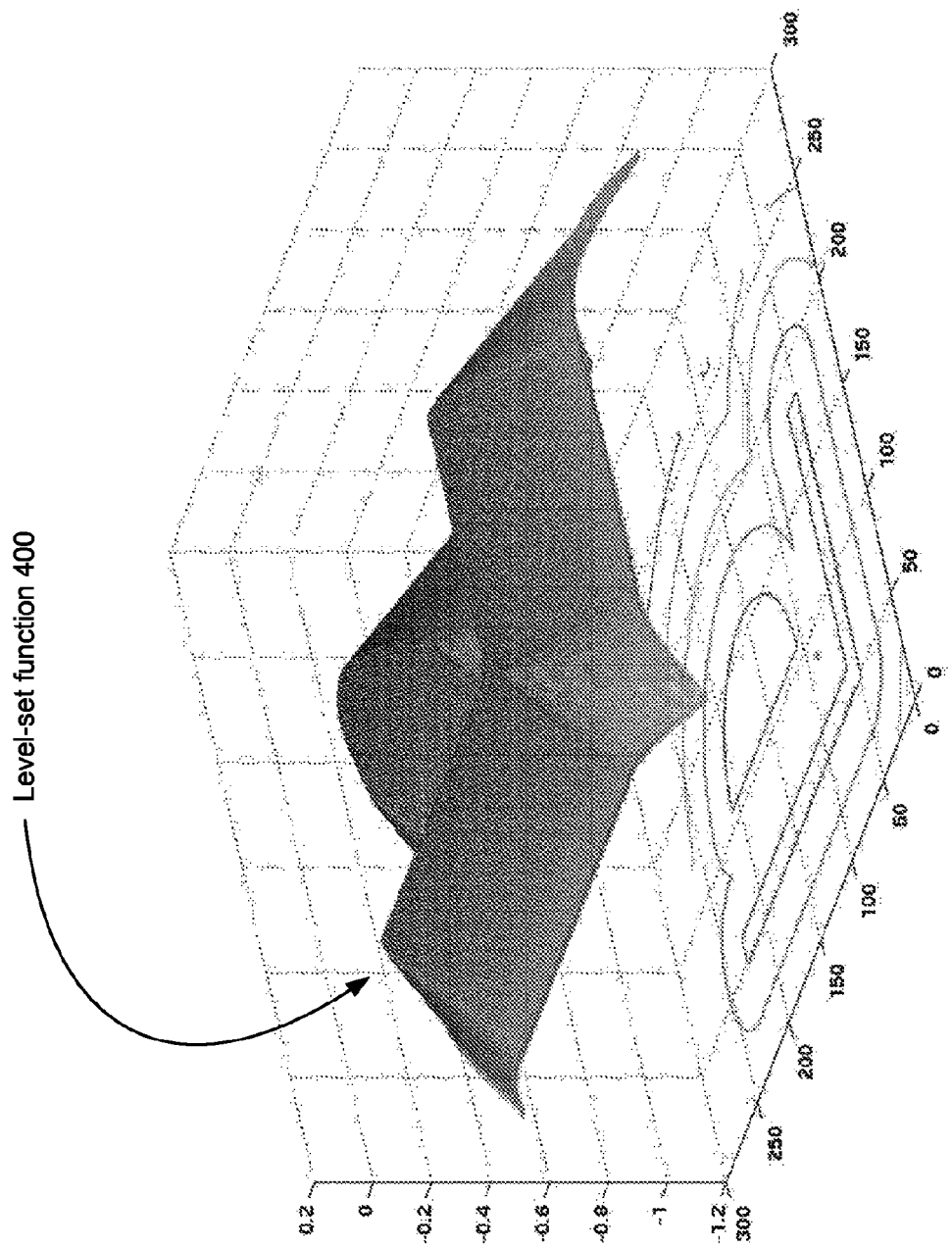
FIG. 4a is a diagram illustrating a level-set function representing the example photomask pattern of FIG. 2 by defining the contours which enclose the regions in the photomask pattern, according to an embodiment of the present invention.

Because we use contours to define regions in a photomask pattern, we use a mathematical description of such contours. FIG. 4a illustrates a level-set function $\psi(x,y)$ 400 representing example photomask pattern 200 by defining the contours which enclose the regions in photomask pattern 200. $\psi(x,y)$ is a function with the property that 1. $\psi(x,y)=0$ everywhere along the boundary of a region;
2. $\psi(x,y)>0$ "inside" a region (for example, those regions corresponding to the chrome portions of the mask);
3. $\psi(x,y)<0$, or is negative "outside" a region (for example, those regions corresponding to the clear quartz portions of the mask).

Figure 4B:
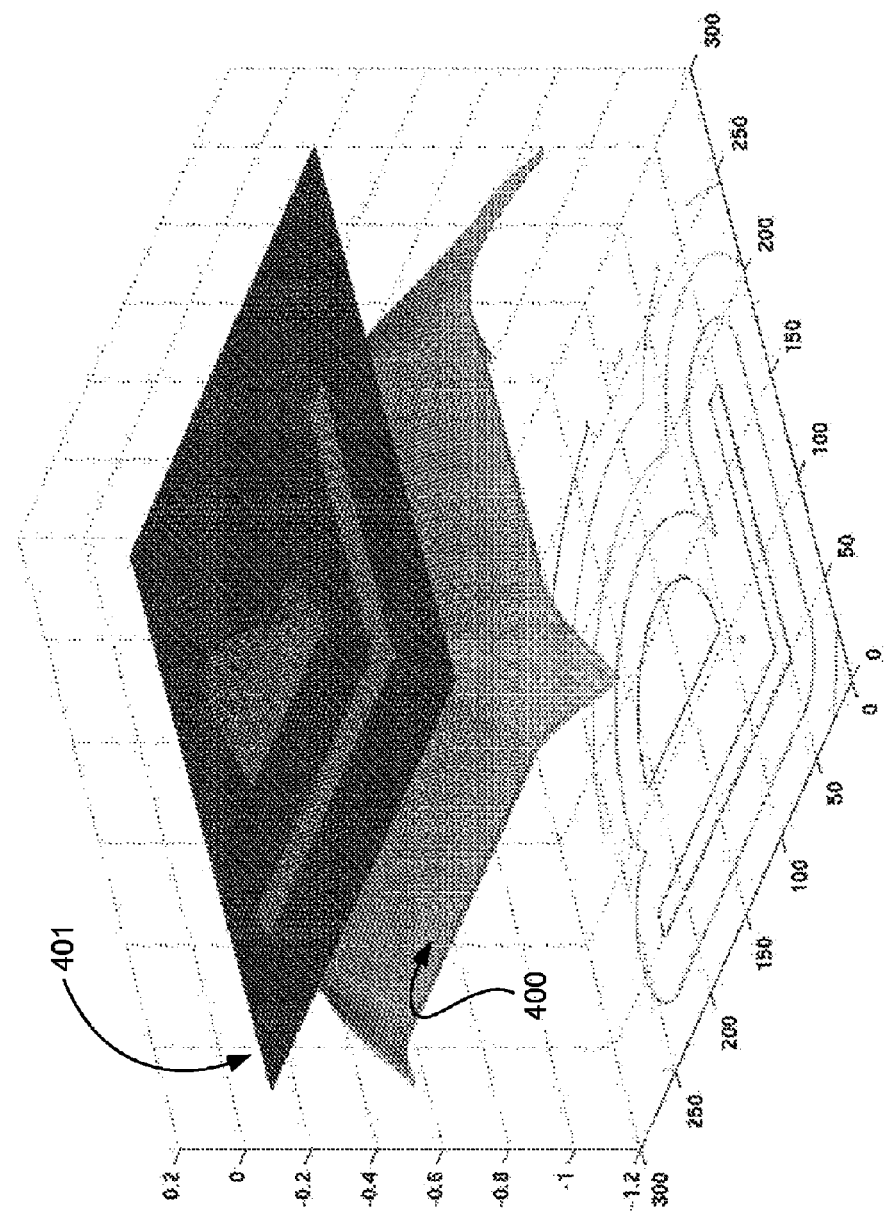
FIG. 4b is a diagram illustrating the level-set function of FIG. 4a intersected with the zero plane parallel to the (x,y) plane, according to an embodiment of the present invention.

The contours are defined by the "level-set", i.e. those values in the (x,y) plane such that $\psi(x,y)=0$. FIG. 4b illustrates the level-set by intersecting the level-set function 400 with the zero plane 401 parallel to the (x,y) plane.

It is an aspect of the present invention to, given a target pattern, find a level-set function $\psi(x,y)$ such that the level-set $\psi(x,y)=0$ defines a set of contours, which, when interpreted as the boundaries of regions of a pattern on a photomask, correspond to the design of a photomask producing a wafer pattern with little distortions and artifacts compared to the target pattern, wherein the wafer pattern results from a photolithography process using the photomask. The extent to which the set of contours defined by a level-set function $\psi(x,y)$ is optimal is calculated using a functional known as the "merit function", also referred to herein as the "Hamiltonian" H. The Hamiltonian H of a level-set function $\psi(x,y)$ is indicative of the degree of similarity between the printed wafer pattern and the desired target pattern, the printed wafer pattern resulting from a photolithography process using a photomask given by the contours defined by $\psi(x,y)$. (We call the "merit function" the "Hamiltonian" by way of analogy to the Hamiltonian function used in classical dynamics or quantum mechanics).

Mathematically, the Hamiltonian H is a functional which maps a function to a real number:

$$H:C(\mathcal{R}^2)\to\mathcal{R}$$

Optionally, the Hamiltonian also depends upon a number of real parameters, or, as described below, is a function of multiple level-sets. The Hamiltonian is chosen so that the optimal solution has the smallest value, i.e. we seek to find a level-set function which minimizes the Hamiltonian. It follows that, once an appropriate Hamiltonian is specified, the problem of finding an optimally designed photomask is equivalent to the problem of finding a level-set function which minimizes the Hamiltonian. It also follows that the specification of an appropriate Hamiltonian is a valuable step in applying the principles of our invention, given that the form of the Hamiltonian functional will directly determine the contours which result from the optimization problem.

Note that our description of the problem in terms of minimizing a Hamiltonian function is for purposes of description and not by way of limitation. Equivalent alternatives are available to one of ordinary skill in the art based on the presented description (for example formulating the optimization problem as a maximization problem rather than a minimization problem, or assigning negative values to the level-set function values at points on the inside of enclosed regions and assigning positive values to the points on the outside of enclosed regions, or by choosing a level-set other than the zero level-set to specify contours, etc.).

Figure 5:
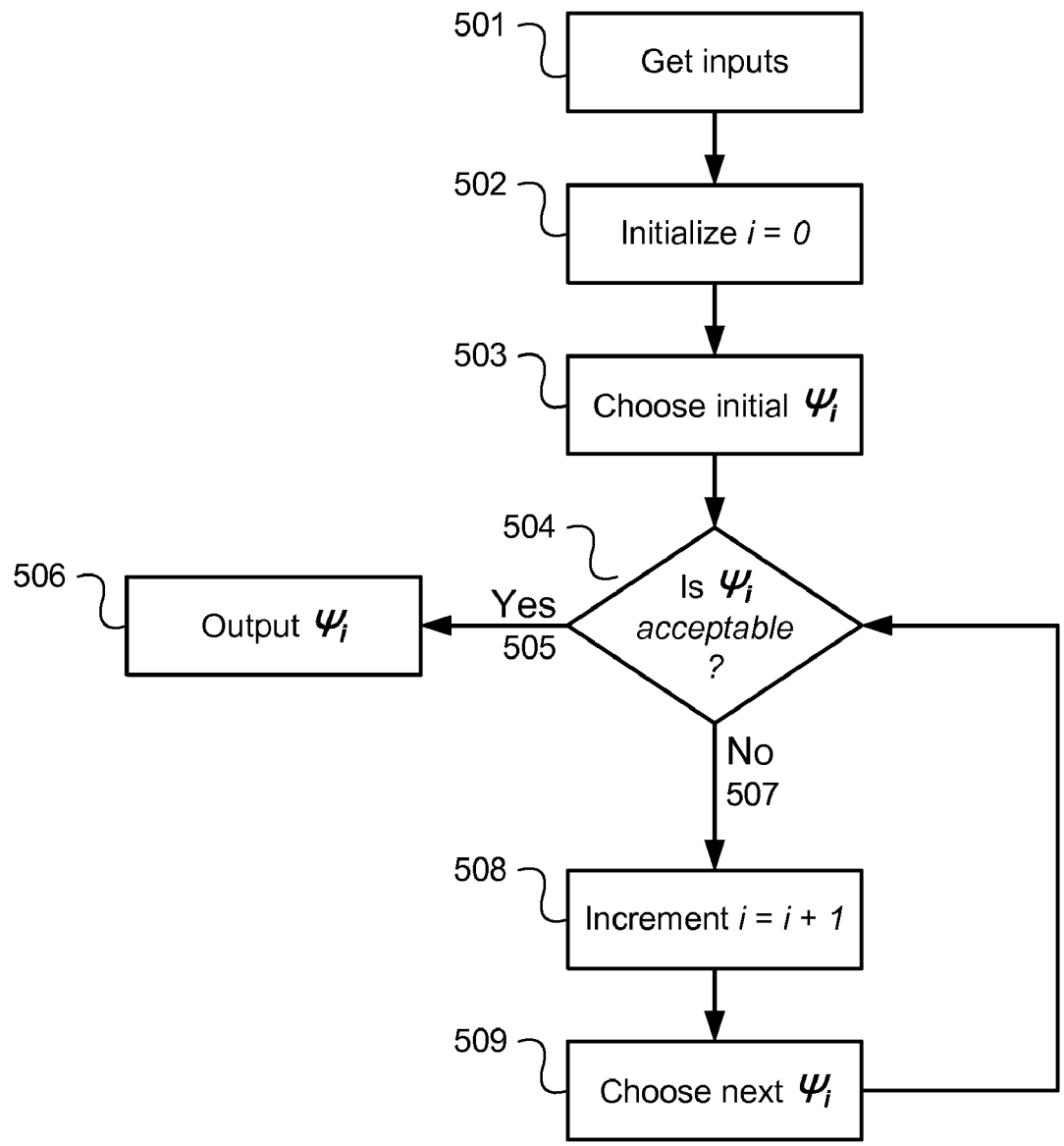
FIG. 5 is a flow chart illustrating a method for time-evolving contours of a photomask pattern in order to minimize a Hamiltonian function, according to a preferred embodiment of the present invention.

FIG. 5 is a flow chart illustrating a method for time-evolving contours of a photomask pattern in order to minimize a given Hamiltonian function, according to a preferred embodiment of the present invention. FIG. 5 depicts the steps used to find a level-set function which defines an optimal photomask for a given target pattern. The level-set function is found by iteratively refining an initial guess so that the refinements progressively result in better "merit" values, i.e. decrease a Hamiltonian H, wherein H depends on the target pattern, the particular photolithography process under consideration, constraints on the photomask manufacturing, and other factors to be described in detail below. We briefly describe the steps in FIG. 5 prior to providing the detail.

Start 501 with a set of initial inputs, which may include a target pattern, parameters describing the particular photolithography process under consideration, mask manufacturing restrictions, and other factors to be described in detail below. Initialize 502 i=0 and choose 503 an initial level-set function $\psi_i(x,y)=\psi_0(x,y)$. Determine 504 whether $\psi_i(x,y)$ is acceptable (details on determining this below). If $\psi_i(x,y)$ is 505 determined to be acceptable, output 506 $\psi_i(x,y)$ as the result of the minimization, and finish. Otherwise 507, increment 508 i by one and choose 509 a next $\psi_i(x,y)$ so as to gain an improvement (details on choosing next $\psi_i$ appear below), repeating until $\psi_i(x,y)$ is determined 507 to have acceptable "merit", and finishing by outputting 506 the final $\psi_i(x,y)$ as the result of the minimization. Because the initial level-set function $\psi_0$ changes through each iteration, it can be thought of as evolving with time, and it is convenient to think of each successive function $\psi_i(x, y)$ as a discrete snapshot of a continuously evolving "time-dependent level-set function" $\psi(x, y, t)$ of space and time (t denoting time).

Figure 6A:
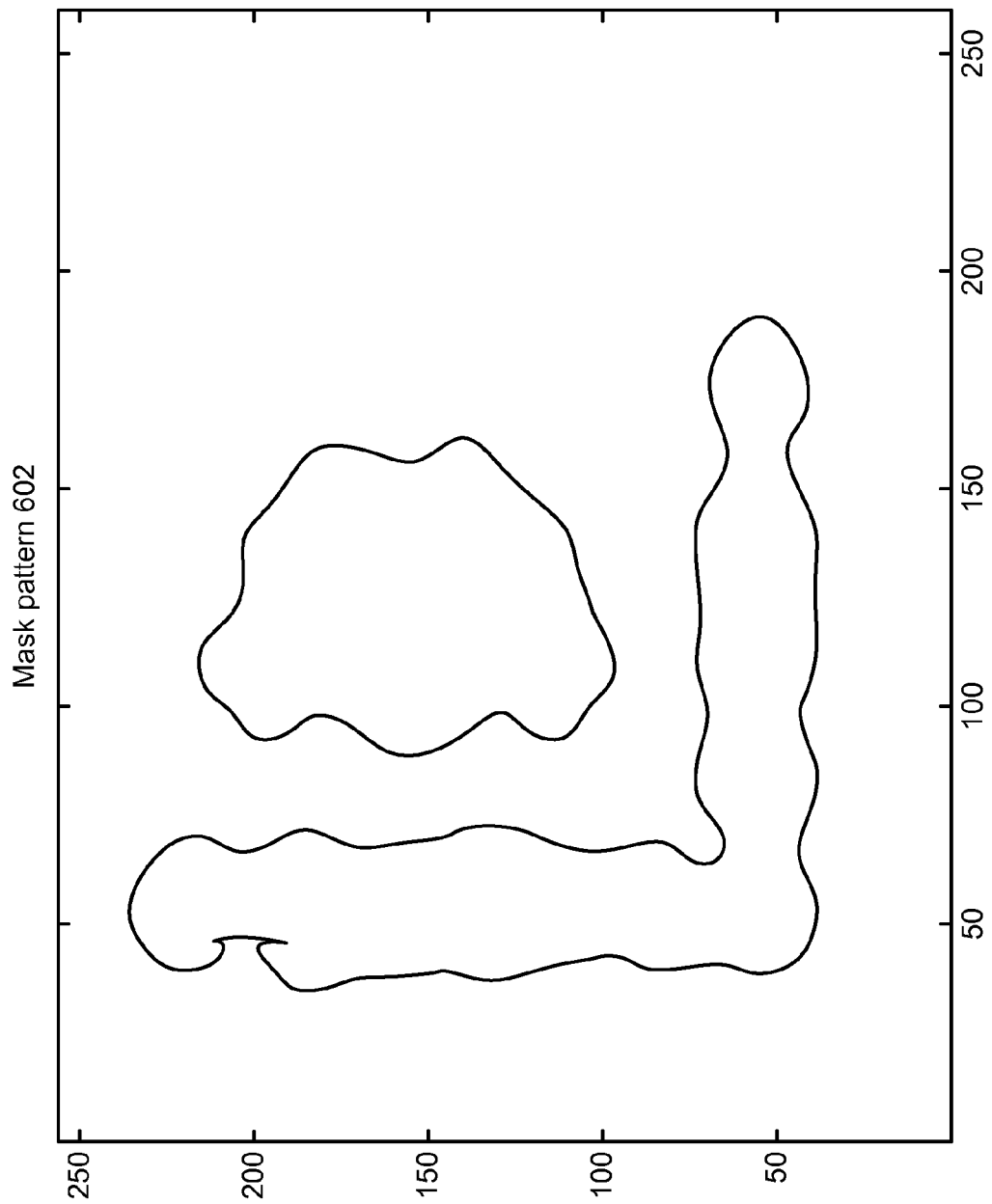
FIG. 6a is a diagram illustrating a photomask pattern, according to an embodiment of the present invention.
Figure 6B:
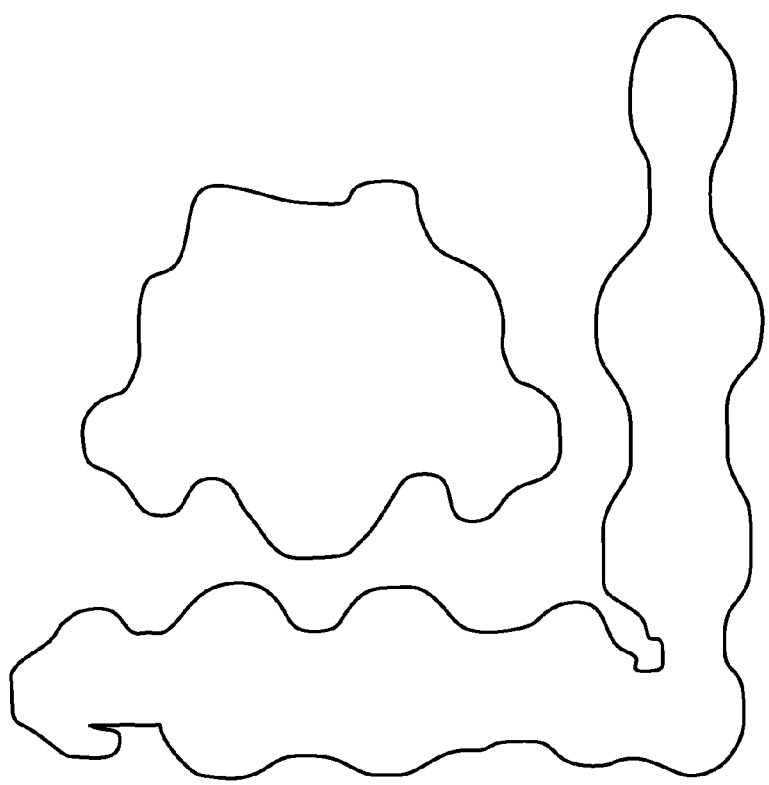
FIG. 6b is a diagram illustrating a photomask pattern corresponding to a final level-set function output by the algorithm, according to an embodiment of the present invention.
Figure 6C:
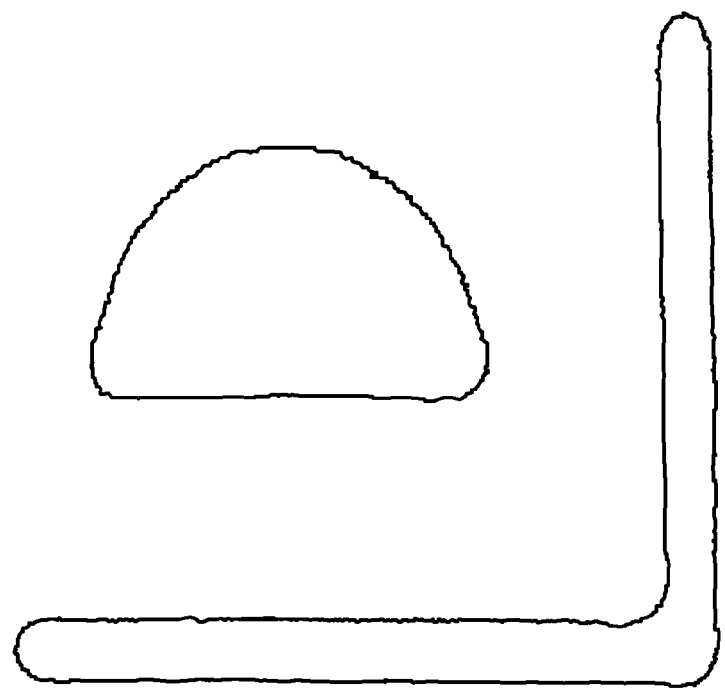
FIG. 6c is a diagram illustrating a wafer pattern as produced using the photomask pattern of FIG. 6b in a photolithography process.

FIG. 6a illustrates a photomask pattern 602 corresponding to a level-set function $\psi_i(x, y)$ after about 500 iterations of the algorithm. FIG. 6b illustrates a photomask pattern 603 corresponding to a final level-set function output by above optimization algorithm. FIG. 6c illustrates a wafer pattern 604 as produced using photomask pattern 603 of FIG. 6b in a photolithography process.

In one embodiment, a succeeding function $\psi_{i+1}(x, y)$ is chosen by adding a small change $\Delta_i(x, y)$ to the current level-set function $\psi_i(x, y)$, wherein $\Delta_i(x, y)$ is another function over the same domain as $\psi_i(x, y)$:

$$\psi_{i+1}(x,y) = \psi_i(x,y) + \Delta_i(x,y) \qquad (1)$$

Figure 6D:
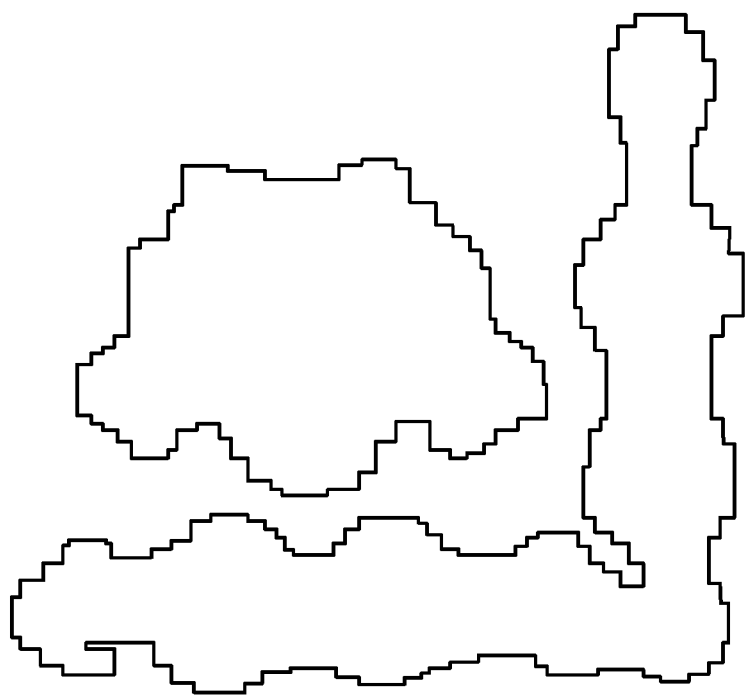
FIG. 6d is a diagram illustrating a rectilinear photomask pattern output by the algorithm based on the initial photomask shown in FIG. 2, according to an embodiment of the present invention.
Figure 6E:
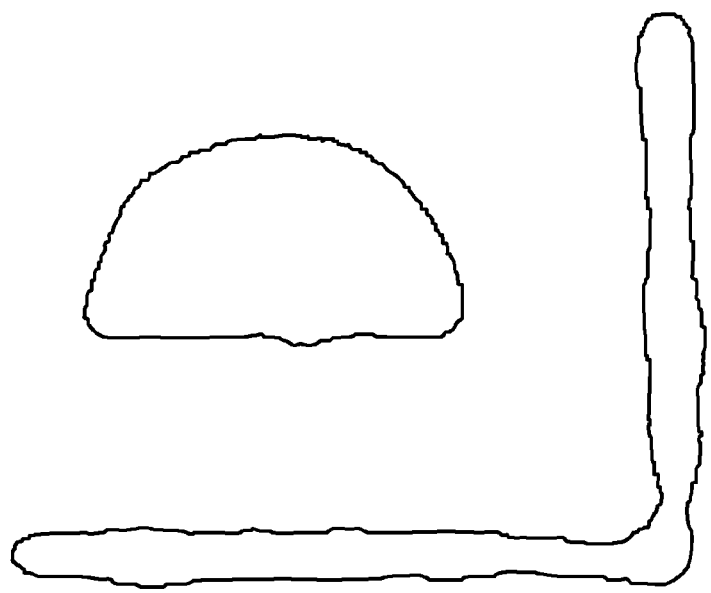
FIG. 6e is a diagram illustrating a wafer pattern as produced using the rectilinear photomask pattern of FIG. 6d in a photolithography process, according to an embodiment of the present invention.

In a preferred embodiment, a succeeding function $\psi_{i+1}(x, y)$ is chosen by first adding a small change $\Delta_i(x, y)$ to the current level-set function $\psi_i(x, y)$ and then projecting the resulting sum onto a sub-space which constrains the contours to be rectilinear (details on the projection appear below). FIG. 6d illustrates a rectilinear photomask pattern 605 output by above algorithm based on the initial photomask 200 shown in FIG. 2. FIG. 6e illustrates a wafer pattern 606 as produced using rectilinear photomask pattern 605 of FIG. 6d in a photolithography process.

In one embodiment of our invention, we calculate $\Delta_i(x, y)$ as follows:

$$\Delta_i(x, y) = \Delta t \cdot \left\{ \frac{\delta H}{\delta \psi} \bigg|_{\psi=\psi_i} + R(\psi_i) \right\} \cdot |\nabla \psi_i| \qquad (2)$$

where $\Delta t$ is a small constant hereinafter referred to as "time-step", $$\frac{\delta H}{\delta \psi}$$

is the Frechet derivative of the Hamiltonian H, $R(\psi)$ is a "regularization term" which slightly modifies the evolution of the level-set function to improve numerical stability, and $|\nabla \psi_i|$ is the norm of the gradient of the level-set function $\psi_i(x, y)$. Each of these terms as well as the projection operation will be described in more detail below.

In still another embodiment of our invention, we use the continuous-time version of equation (2) above and time-evolve the time-dependent level-set function according to the equation $$\frac{\partial}{\partial t} \psi(x, y, t) = \left\{ \frac{\delta H}{\delta \psi} + R(\psi) \right\} \cdot |\nabla \psi| \qquad (3)$$

which can be implemented computationally using a variety of techniques different from the discretization described in equation (2) above, but that are known to one of ordinary skill in the art.

Figure 7:
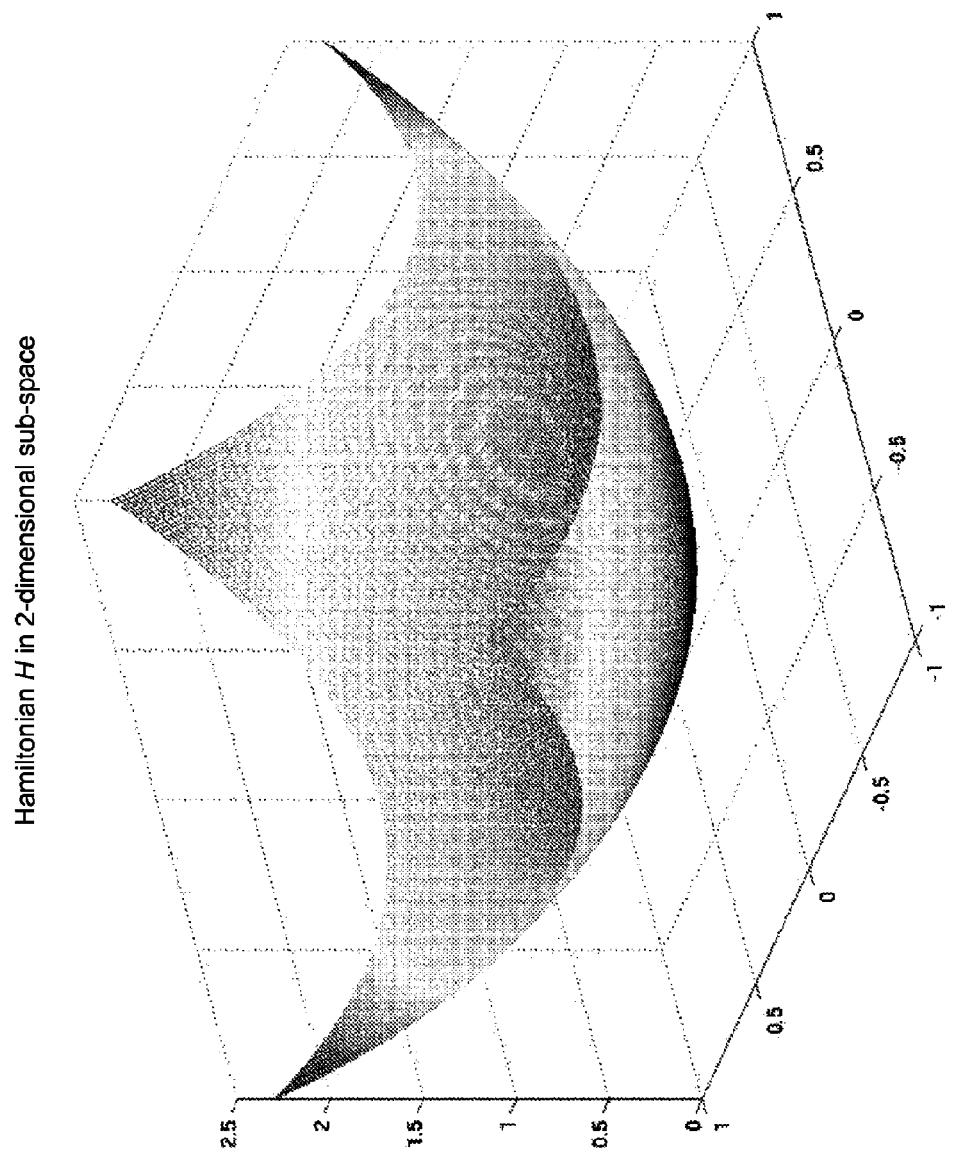
FIG. 7 is a diagram illustrating a 2-dimensional sub-space of an in-dimensional solution space of level-set functions, showing Hamiltonian H as a function of $\psi(x_1,y_1)$ and $\psi(x_1,y_2)$, according to an embodiment of the present invention.

In a preferred embodiment, and to facilitate computation, a level-set function $\psi_i(x, y)$ is represented by a discrete set of m function values over a set of m points in the (x, y) plane. In one embodiment, the set of m points comprises a grid spanning an area representing the photomask. Alternatively, the set of m points is chosen according to a different arrangement in the area representing the photomask. From this perspective, a level-set function $\psi_i(x, y)$ and a "small change" function $\Delta_i(x, y)$ are determined by their values at the set of m points and consequently can be considered as m dimensional vectors in "solution space." FIG. 7 is an illustration of the possible values for the first two components of an m-dimensional vector representing a level-set function, i.e., illustrating a 2-dimensional sub-space of solution space. In the subspace shown, we plot H as a function of $\psi(x_1,y_1)$ and $\psi(x_2,y_2)$. For this example, both $\psi(x_1,y_1)$ and $\psi(x_2,y_2)$ can vary between $-1$ and $+1$. The minimum in this example is seen to occur at $\psi(x_1,y_1)=0.3$ and $\psi(x_2,y_2)=-0.2$. Starting with an initial guess at a level-set function $\psi_0(x,y)$, we approach the minimum by taking a small step (in step 509) in the direction of "steepest descent" to obtain a new location which is closer to a minimum. By repeating this process we quickly reach a minimum. Time-evolving the level-set function according to above preferred embodiment is analogous to the foregoing, except that the dimensionality of the entire "solution space" is much greater than 2 (for example, it can equal the number of grid points m in the discretized version, or be infinite in a continuous version).

From the above discussion, it is seen that one can find the minimum without actually calculating the Hamiltonian. However, it may be useful to calculate the Hamiltonian in order to determine the "merit" of the current level-set function. For example, it may be reasonable to stop iterating, even before the algorithm converges on an optimal solution, if a sufficient solution has been found. Similarly, one may wish to check the Hamiltonian occasionally (every several iterations), or only at those times when an adequate solution seems likely to have been found, such as when the level-set evolution generates only small changes in the succeeding level-sets. At this point we shall reexamine the steps of the flow chart of FIG. 5 in more detail:

Input

The algorithm starts 501 with a set of inputs, among them a target pattern given in a particular format ("pattern I/O formats"). The target pattern may be presented in a variety of formats, including, but not limited to:

1. Image formats, such as bitmaps, JPEGs (Joint Photographic Experts Group), or other image formats;
2. Semiconductor industry formats, such as CIF, GDSII, Oasis, OpenAccess; or
3. Proprietary formats, such as an Electronic Design Automation (EDA) layout database.

The target pattern itself may be a representation of various types of content, for example (but not limited to):

1. One or more levels of an IC design for a particular IC type;
2. A pattern for a non-IC application (e.g. a MEMs device);
3. A pattern which can be used as part of a larger design, such as a standard cell, or DRAM bit cell, etc.

The algorithm also accepts one or more constraints as input, including (but not limited to) target pattern or mask pattern constraints, which may be specified as rules (such as critical dimensions, tolerances, etc.); and target pattern or mask pattern constraints specified as additional images (in a "pattern I/O format") specifying for example maximal or minimal areas to be covered, or critical regions, etc.

It is contemplated that the teachings of the present invention can be used to refine a photomask pattern determined through some other process, and that the output of the algorithm of present invention could be fed, or otherwise used, as input into another technique or methodology for optimally providing a photomask. In general, an iterative process is contemplated in which a mask pattern is taken through a series of transformations, with the teachings of the present invention accomplishing a subset of those transformations.

Other accepted inputs include parameters of the Hamiltonian function, including but not limited to parameters of the physical model used to simulate the photolithographic process, and parameters indicating the desired attributes of the eventual solution. These may include, for example, the number and type of photomasks employed, the wavelength of a stepper machine, the type and properties of the illumination, the type and properties of the photoresist, the type and properties of the lens, etc. Other parameters may include properties of error sources, such as defocus, exposure, alignment, defects, etc.

Initialization

After receiving inputs in step 501 and initializing 502 i=0, we initialize 503 the level-set function $\psi_0$. In theory, almost any level-set initialization should be sufficient; however, initial conditions can have an impact on the time required for convergence and therefore on the cost of the process. Moreover, it is possible that for sufficiently poor initial conditions the algorithm will fail to converge.

A variety of ways to initialize the level-set function will be apparent to one of ordinary skill in the art. In one embodiment of the present invention, the initial level-set function is chosen, according to an initial photomask pattern comprising enclosed regions (to be chosen below), by assigning 1. the value +1 to $\psi_0(x, y)$ everywhere within the enclosed regions of the photomask pattern;
2. the value −1 to $\psi_0(x, y)$ everywhere outside the enclosed regions of the photomask pattern; and
3. the value 0 to $\psi_0(x, y)$ at the boundaries (contours) of the regions of the photomask pattern.

However, it is desirable to have a smoother and approximately continuous function as the level-set function. In a preferred embodiment of the present invention, the level-set function is a "distance function," wherein the value of the function at a given point represents the (signed) distance of the point to the (nearest) boundary of a region in photomask pattern (positive inside a region's boundary, negative outside). Such a distance function has a variety of useful properties. For example, in the context of the present invention, a distance function allows for computations that depend not just on what is inside a region's boundary or outside a region's boundary, but what is "near" the boundary, where "near" is functionally based on distance. As the level-set function evolves, it slowly loses its property as a distance function. However, this can be corrected using a "re-distancing" process, known to one of ordinary skill in the art.

It remains to determine an initial photomask pattern on which to base the choice of the initial level-set function $\psi_0(x, y)$ in step 503. A variety of possible choices are available including (but not limited to) the following:

1. Random. This is unlikely to be the choice leading to fastest minimization, but it should be very robust;
2. The target pattern. Especially for the case of a single chrome, and glass mask, choosing the initial mask pattern to be equal to the target pattern is likely to perform fairly well. This is because it is possible for the final mask pattern to be similar to the target pattern;
3. The result of heuristics applied to the target pattern. For example, an OPC algorithm is applied to the target pattern, with the result used as the initial mask pattern. For multiple mask processes, one approach is to use heuristics to split the pattern into multiple exposures, for example, separating horizontal and vertical lines;
4. Results from previous solutions to the same or similar problems. These are likely to be similar to the desired final pattern; or
5. Results from solutions to other similar regions on the mask. As above, these are likely to yield similar solutions. One can imagine, for example, that the mask comprises individual mask areas. As pattern on such individual areas are optimized, the solutions can be used as initial guesses for other areas. Since the optimal solution for a given area will depend upon interactions with neighboring areas, the solutions may not be the same. However, the optimal solution from one area may serve as a good initial guess for another similar area.

There are numerous ways to initialize an original target photomask pattern. The previous possibilities that have been described are meant only as a partial list of possible alternatives.

In one embodiment, a level-set function is stored as an array of values representing the value of the level-set function at fixed points on a 2-dimensional grid. Optionally, a more sophisticated approach (referred to as "local level-set") only stores the values near the boundaries; depending upon the pattern and the resolution, this can be significantly more efficient. Other ways of representing and storing a level-set function will be apparent to one of ordinary skill in the art.

Checking the "Merit"

As seen in the flow chart, in step 504 the algorithm determines if it has converged upon a suitable set of contours so as to provide an optimal photomask. In one embodiment, this check is performed after each step in the evolution of the contours (defined by the level-sets). Alternatively, this check is performed after two or more steps of the level-set evolution.

One simple method to determine whether an acceptable solution has been found (in step 504) is to calculate the value of the Hamiltonian $H(\psi_i)$ resulting in a "merit" of the current level-set solution. Alternatively, a solution is deemed acceptable based on the number of iterations performed. It may be advantageous to use locally defined criteria to stop iterating in areas of the photomask where the solution is already acceptable, and to continue iterating in areas where the solution has not yet reached an acceptable level of merit. In this context, "local" can mean on the level of a pixel, on the level of a small area (for example, an interaction distance), on the level of a hierarchical subdivision of the mask area, or on other alternative levels.

Yet another indication of convergence is provided by the magnitude of the gradient (in "solution space") or Frechet derivative—as the contours approach an optimal state, the derivative decreases and approaches zero. Similarly, the change in the shape of the contours from one iteration to another iteration provides an indicator of convergence. Although we have described several indicators, one of ordinary skill in the art will recognize other indicators as well.

Time-Evolving Contours

As described above, in a preferred embodiment a level-set function evolves in a series of steps in which we add to it a small function $\Delta_n(x, y)$ calculated via equation (2)

$$\Delta_i(x, y) = \Delta t \cdot \left\{ \frac{\delta H}{\delta \psi} \bigg|_{\psi = \psi_i} + R(\psi_i) \right\} \cdot |\nabla \psi_i|$$

It is common for the optimization problem of the present invention to be mathematically "ill-posed" in the sense that the solution may be non-unique. In order to avoid inherent numerical instabilities during the time evolution we employ a "regularization" technique, adding a small term $R(\psi)$ to the Hamiltonian H in order to help stabilize the time evolution. The resulting contours will have less "noise" and appear smoother to the eye. There are many ways to add regularization which will be apparent to those skilled in the art, including (but not limited to):

$$R(\psi) = \nabla \cdot \frac{\nabla \psi}{|\nabla \psi|}. \qquad 1$$

Mean curvature regularization—Adding this term tends to reduce noise in the image by minimizing the length of contours.

$$R(\psi) = \nabla \cdot \frac{\nabla \psi}{|\nabla \psi|} - \overline{\nabla \cdot \frac{\nabla \psi}{|\nabla \psi|}}. \qquad 2$$

(with the bar indicating the average).

Average mean curvature—This tends to minimize the length of the boundaries while keeping the total area of the enclosed regions fixed, giving preference to smoother contours and contours enclosing larger regions, since larger regions have less boundary per unit area as compared to many small regions.

$$R(\psi) = \frac{\partial}{\partial x}\left(\frac{\psi_x}{|\psi_x|}\right) + \frac{\partial}{\partial y}\left(\frac{\psi_y}{|\psi_y|}\right). \qquad 3$$

Wulf-crystal regularization or Wulf curvature—This is similar to curvature except that it prefers Manhattan geometries. Other variations of Wulf regularization can be used preferring straight edges in Manhattan geometries or 45 degree angles. Use of Wulf-crystal regularization may be helpful in the design of masks with rectilinear contours, although it will not guarantee rectilinear geometries.

$$R(\psi) = \frac{\partial}{\partial x}\left(\frac{\psi_x}{|\psi_x|}\right) + \frac{\partial}{\partial y}\left(\frac{\psi_y}{|\psi_y|}\right) - \overline{\frac{\partial}{\partial x}\left(\frac{\psi_x}{|\psi_x|}\right) + \frac{\partial}{\partial y}\left(\frac{\psi_y}{|\psi_y|}\right)}. \qquad 4$$

Average Wulf curvature—Combining aspects of average mean curvature and Wulf curvature, this exhibits a preference for rectilinear contours enclosing large regions.

In all of the above regularization expressions, it is possible for the denominator in one or more of the fractions to equal zero. In order to avoid dividing by zero, one can add a small constant to the denominator, or set the expression equal to zero whenever both the numerator and denominator equal zero.

One of ordinary skill in the art will recognize other possibilities for regularization. It should be obvious that it may be desirable for the amount or type of regularization to change with time as the contours evolve, and that alternative ways of introducing regularization are apparent to those skilled in the art and are part of the teachings of the present invention.

In equation (2), as well as in several of the regularization expressions, we need to compute $|\nabla \psi|$. The way in which the gradient is computed can have important consequences in terms of numerical stability. Preferably, techniques for calculating gradients known to those skilled in the art as Hamilton-Jacobi Essentially Non-Oscillatory (ENO) schemes or Hamilton-Jacobi Weighted Essentially Non-Oscillatory (WENO) schemes are used. Alternatively, other ways of computing the gradient are used, as are known to one of ordinary skill in the art.

In a similar vein, the time evolution of the time-dependent level-set function can be implemented using a variety of numerical techniques. One embodiment described above uses what is known as "first order Runge Kutta". Alternatively, other variations such as third order Runge Kutta can be used as will be obvious to those skilled in the art.

The method of gradient descent involves multiple iterations; the size of the function $\Delta_t(x, y)$ chosen as part of performing step 509 is scaled by the "time-step" $\Delta t$ appearing in equation (2). The larger the time-step, the faster the system converges, as long as the time-step is not so large so as to step over the minimum or lead to numerical instabilities. The convergence speed of the algorithm can be improved by choosing an appropriate time-step.

There are numerous ways to choose the time-step $\Delta t$. In one embodiment, we choose a time step that is just small enough so as to guarantee that the system is stable. In an alternative embodiment, we start with a large time step and gradually reduce the time step as the algorithm approaches a minimum. In an alternative embodiment, we vary the time step locally and per sub-area of the photomask. Other approaches will be known to those skilled in the art, or other means of adapting the time step to the specific situation.

In another embodiment, one can use what are known as implicit methods, optionally with linear-preconditioning, in order to allow for a larger time-step. Still other variations will be known to one of ordinary skill in the art.

Analogous to refining the time granularity by reducing the time-step, in one embodiment of the present invention the granularity or placement of the grid of points on the photomask is adjusted in a time-dependent fashion as the algorithm approaches convergence. By performing the initial iterations on a larger grid, and increasing the number of grid points with time as greater accuracy is desired, a solution is obtained more quickly. Other such "multi-grid" techniques will be apparent to those skilled in the art. Another possibility is using an adaptive mesh technique, whereby the grid size varies locally.

It is possible that the process of time-evolving the contours arrives at a configuration from which there is no "downhill" path in "solution-space" to a solution, or in which such paths are inordinately long or circuitous. In such a state, convergence may require a large number of iterations. Also, the algorithm may get "stuck" at a local (but not global) minimum. Some example techniques for handling such a situation are as follows:

1. Changing the Hamiltonian. Various modifications can be made to the Hamiltonian in order to bridge local minima in solution space; for example, regularization terms can sometimes be used for this purpose;
2. Addition of random bubbles. Adding random noise to a level-set function will create new regions, which can then time-evolve into the solution. Noise (that is distortion) can be purposefully added at random or it can be targeted in specific regions (for example, known problematic target geometries, or regions which are not converging on their own to acceptable errors, etc.);
3. Heuristic bubbles. Rather than adding random noise, a specific modification feature, known from experience to generally help the system converge, is added; for example, if certain areas appear to be evolving too slowly, one could add a constant to the level-set function in that area, thereby making all the features in that area "bigger";
4. Uphill steps. By making uphill moves, either at random, or specifically in places, the algorithm avoids getting stuck in local minima and works toward a global minimum. Similar techniques from discrete optimization or simulated annealing which are useful to the algorithm of the present invention will be apparent to one of ordinary skill in the art.

Alternatives to the previous example techniques will be apparent to those of ordinary skill in the art.

Projection Operator

In many cases, it is desired to constrain the solution to rectilinear contours, for example to improve manufacturability or reduce costs of the corresponding masks. The present invention enforces this constraint by using a projection operator.

The projection operator can be understood by considering the solution-space of all possible contours, and recognizing that the set of rectilinear contours is a sub-space of the solution-space. The projection operator constrains the evolution of the contours to within the sub-space of rectilinear contours.

The projection operator takes a set of possibly curvilinear contours and approximates them with a set of rectilinear contours. In one embodiment, choose a fixed grid size (possibly corresponding to manufacturing capabilities), and "round" every contour to the nearest grid. This is accomplished, for example, by setting the level-set function to be positive if the majority of the points within a single grid-cell are positive, negative if the majority of the points within a single grid-cell are negative, and zero along the boundaries. Alternative implementations of the projection operator will be apparent to one of ordinary skill in the art.

In one embodiment of the present invention, the projection operator is applied to the level-set function after each time-step iteration. In this way, the contours are always constrained to be rectilinear. In an alternative embodiment, the contours are allowed to evolve for multiple time-steps between applications of the projection operator, in which case the contours may temporarily deviate from strict rectilinear form. The preferred frequency of projection will depend upon factors such as speed of computation, choice (or implementation) of the projection operator, or the manner (or implementation) of the curvilinear time-evolution.

Merit Function/Hamiltonian

As illustrated, the optimization problem and the resulting contours are determined by a merit function referred to as the Hamiltonian. There are many alternative ways to choose a merit function within the scope of the present invention. In one embodiment, the Hamiltonian comprises a sum of two parts:

1. A first part, based upon the level-set contours themselves; and
2. A second part, based upon the resulting pattern which would be printed on a wafer or die given the photomask corresponding to the level-set contours.

The first part of the Hamiltonian may comprise one or more terms such that the resulting optimized photomask pattern has properties which are desirable from a manufacturing point of view; for example, the "regularization" terms described above can be viewed as elements of the Hamiltonian that exhibit a preference for contours corresponding to more easily manufacturable masks.

The second part of the Hamiltonian takes into consideration a model of the photolithographic process, i.e. a method for calculating the wafer pattern resulting from a particular mask pattern (a "forward model"). Following describes an example forward model for one embodiment of the present invention.

In a typical photolithographic process, light passes through the photomask and the lens, and then falls upon the wafer, where the photoresist is exposed. For coherent illumination, the electric field falling upon the photomask is approximately constant. The clear regions of the mask pass the light, while the opaque regions block the light. It follows that the electric field, just behind the mask, can be written as:

$$M(\vec{r}) = \begin{cases} 0 & \text{chrome} \\ 1 & \text{glass} \end{cases}$$

where $\vec{r}=(x,y)$ i is a point on the (x,y) plane. Corresponding to an embodiment of the present invention wherein the regions in which the level-set function is positive indicate glass and the regions in which the level-set function is negative indicate chrome (with the level-set equal to zero at the boundaries or contours), one can write the previous expression as a function of a level-set function $\psi(x,y)$ as follows:

$$M(\vec{r})=\hat{h}(\psi(x,y))$$

wherein $\hat{h}$ is the Heaviside function:

$$\hat{h}(x) = \begin{cases} 1 & x \geq 0 \\ 0 & x < 0 \end{cases}$$

Because an ideal diffraction limited lens acts as a low-pass filter, this will serve as a good approximation to the actual (almost but not quite perfect) lens used in a typical photolithographic process. Mathematically, the action of the lens would then be written as follows:

$$A(\vec{r})=f^{-1}(\hat{C}(f(M(\vec{r}))))$$

where $A(\vec{r})$ indicates the electric field distribution on the wafer, f indicates a Fourier transform, $f^{-1}$ indicates an inverse Fourier transform, and $\hat{C}$ indicates the pupil cutoff function, which is zero for frequencies larger than a threshold determined by the numerical aperture of the lens, and one otherwise:

$$\hat{C}(k_x, k_y) = \hat{h}(k_{max}^2 - [k_x^2 + k_y^2]) = \begin{cases} 0 & k_x^2 + k_y^2 \geq k_{max}^2 \\ 1 & k_x^2 + k_y^2 < k_{max}^2 \end{cases}$$

wherein $k_x$, $k_y$, and $k_{max}$ represent frequency coordinates in Fourier space.

Finally, we determine the image in the photoresist upon the wafer. In one embodiment this process is modeled using a "threshold resist": in regions where the intensity is greater than a given threshold (which we shall call $I_{th}$), the resist is considered exposed; in regions below the threshold, the resist is considered unexposed. Mathematically, this is handled once again with a Heaviside function:

$$I(\vec{r})=\hat{h}(|A(\vec{r})|^2-I_{th})$$

Combining the above, we find that:

$$F(\psi(x,y))=\hat{h}(|f^{-1}(\hat{C}(f(\hat{h}(\psi(x,y)))))|^2-I_{th})$$

This is a self-contained formula which reveals the wafer pattern corresponding to the photomask pattern defined by the level-set function, within the context of the model just described. It should be emphasized that this is just one particular possible forward model that can be used within the scope of our invention, chosen by way of example due to its relative simplicity. More sophisticated forward models also fall within the scope of the present invention. Such models would take into account, by way of example but not limitation, multiple exposures, various illumination conditions (e.g., off-axis, incoherent), the actual electromagnetics of the light field interacting with the photomask, various types of photomasks besides chrome on glass (e.g., attenuated phase shifting, strong phase shifting, other materials, etc.), the polarization of the light field, the actual properties of the lens (such as aberrations), and a more sophisticated model of the resist (e.g., diffusion within the resist), such as a variable threshold model, lumped parameter model, or a fully three dimensional first principles model.

Because the inverse algorithm requires many iterations of the forward algorithm, the latter preferably is implemented efficiently. However, as a general rule, more sophisticated models are likely to run slower than simpler models. One embodiment of the present invention compensates for this difference in model speed by beginning with a simpler model and then gradually introducing more sophisticated models as the process converges, thereby postponing the full complexity until the last iterations. In an alternative embodiment, switching between different models at different time steps obtains an averaging effect. For example, this represents an efficient way to explore the space of error-parameters. Other variations will be apparent to one of ordinary skill in the art.

In one embodiment, the Hamiltonian compares the pattern resulting from the forward model with the target pattern in order to determine the figure of merit. For example, an $L_2$-norm may be calculated:

$$H(\psi(x,y))=|F(\psi(x,y))-T(x,y)|^2$$

wherein $T(x,y)$ indicates the target pattern. The $L_2$-norm is indicative of the area of the non-overlapping regions of the two patterns. This metric approaches zero as the two patterns converge. Other examples of determining a figure of merit are as follows:

1. Other Norms. These might include a cubic or other polynomial functions of the differences;
2. Level-set differences. By representing a resulting pattern as a level-set function one can calculate the distance between the boundaries, integrated over the length of the boundaries;
3. Local variations. Different parts of the image may have different degrees of importance when it comes to variations from the target pattern. For example, gates generally need to be much more accurately printed than interconnects. In one embodiment, a weighting function assigns more weight to non-overlapping areas in the portions of the design having higher accuracy requirements. A related approach gives priority to a measure of distances between curve, or to other metrics; or
4. Semantics. Certain types of errors are considered more significant than other types. For example, within small tolerances, variations from the target pattern are irrelevant, whereas variations outside some tolerances are fatal, taking into account the intent of the design and not just the geometry of the design. In one embodiment, use local weightings to account for errors. As an example, consider a gate which must be printed within specific tolerances. Then the weighting factor becomes large for points outside the tolerances. Within tolerances, the weighting factor would be smaller, and optionally still nonzero (so that the algorithm still prefers designs that are closer to the target). Other ways of incorporating design semantics into the merit function will be apparent to one of ordinary skill in the art.

Optionally, an adjustment is provided to the Hamiltonian according to empirical measurements of an actual fabrication process.

Output

The flow chart shown in FIG. 5 ends with an output of the resulting contours, representing a mask suitable for one of the potential photolithography applications and conforming to the specifications and constraints specified in a suitable "pattern I/O format."

Other outputs in addition to the photomask pattern corresponding to the optimized contours are contemplated. In one embodiment, the final value of the Hamiltonian function is output to indicate the merit of the solution, optionally to be interpreted as a probability estimate that the resulting process will print within specification.

Generalizations

Foregoing discussion frequently considers a single level-set function representing contours on a single mask, the interior of those contours corresponding to chrome regions, and the exterior corresponding to glass regions. However, in many cases it will be desirable to find contours separating multiple types of regions on the same mask, for example, chrome, glass, and phase-shifted glass, and/or either alternatively or simultaneously to find contours corresponding to boundaries of regions on multiple masks, to be used in a multiple exposure process. Both generalization fall within the teachings of our invention.

To allow for multiple masks it suffices to simultaneously optimize multiple level-set functions, an algorithm for which follows directly from above discussions: each level-set function time-evolves according to an equation analogous to (2), except that the terms on the right hand side now depend upon multiple level-set functions, instead of just on one.

One can easily allow for multiple types of regions in a similar manner to the way in which one handles multiple masks, i.e., with multiple level-set functions. However, with multiple-types of regions on the same mask, one must prevent regions from overlapping. Consider an example where glass regions correspond to those areas in which the first level-set function is positive, phase-shifted regions correspond to those areas in which the second level-set function is positive, and chrome regions correspond to those areas in which both level-set functions are negative. Prohibiting the possibility for the same region to be both clear glass and phase-shifted glass, add a constraint which prevents both level-sets from being positive in the same area, for example by adding a "penalty" term to the Hamiltonian, the penalty term taking on a very large value whenever the two level-sets overlap. Thus, as the system time-evolves, the contours move so as to remain non-overlapping. It should be apparent that this concept can be extended in a trivial manner to more than two level sets and more than three types of regions. Alternatively, one can allow both level-sets to evolve freely, and assign precedence to one of them, e.g., if both level sets are positive, define the region as clear glass. Other means of representing multiple regions (also called "multi-phase flow" in the literature) will be apparent to those skilled in the art, and fall within the scope of our invention.

Similarly, while the foregoing discussion refers typically to a mask consisting of only chrome and glass regions, these types of regions should not be construed to limit the applicability of the present invention, which is useful for any number of different types of regions. By way of example (but not limitation), phase-shifted regions, regions covered with materials other than chrome (e.g., in an attenuated phase shifting mask), and half-tone regions would all be within the teachings of the present invention.

In still another embodiment, a level-set function can be used to represent the pattern of the illumination optics; as in the foregoing discussion of multiple masks, this level-set function can be optimized simultaneously with those representing one or more photomasks. In yet another embodiment, various parameters of the Hamiltonian can be optimized simultaneously with one or more level-set functions, in an analogous manner.

Accordingly, while there have been shown and described above various alternative embodiments of systems and methods of operation for the purpose of enabling a person of ordinary skill in the art to make and use the invention, it should be appreciated that the invention is not limited thereto. Accordingly, any modifications, variations or equivalent arrangements within the scope of the attached claims should be considered to be within the scope of the invention.

In addition, the foregoing description of the principles of our invention is by way of illustration only and not by way of limitation. For example, although several illustrative embodiments of methodologies in accordance with the principles of our invention have been shown and described, other alternative embodiments are possible and would be clear to one skilled in the art upon an understanding of the principles of our invention. For example, several alternatives have been described for various steps described in this specification. It should be understood that one alternative is not disjoint from another alternative and that combinations of the alternatives may be employed in practicing the subject matter of the claims of this disclosure. Certainly the principles of our invention have utility apart from making photomasks for integrated circuits, some of which we have already mentioned. Accordingly, the scope of our invention is to be limited only by the appended claims.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

We claim:

1. A computer-program product for use in conjunction with a computer system, the computer-program product comprising a non-transitory computer-readable storage medium and a computer-program mechanism embedded therein for determining a mask pattern to be used on a photo-mask in a photolithographic process, wherein the photo-mask has a plurality of distinct types of regions having distinct optical properties, the computer-program mechanism including:
  instructions for providing a first mask pattern that includes a plurality of distinct types of regions corresponding to the distinct types of regions of the photo-mask;
  instructions for calculating a gradient of a function, wherein the function depends on the first mask pattern and an estimate of a wafer pattern that results from the photolithographic process utilizing at least a portion of the first mask pattern, and wherein the gradient is calculated in accordance with a formula obtained by taking a derivative of the function; and
  instructions for generating a second mask pattern based, at least in part, on the gradient of the function.

2. The computer-program product of claim 1, wherein the gradient corresponds to a Frechet derivative.

3. The computer-program product of claim 1, wherein the gradient is a closed-form expression.

4. The computer-program product of claim 1, wherein the gradient is calculated without determining the function.

5. The computer-program product of claim 1, wherein the output of the function further depends on at least a portion of a target pattern that is to be printed by the photo-mask during the photolithographic process.

6. The computer-program product of claim 5, wherein another target pattern is modified to produce the target pattern.

7. The computer-program product of claim 5, wherein the computer-program mechanism further includes instructions for converting a document that includes a polygon-based representation of the target pattern into the target pattern.

8. The computer-program product of claim 5, wherein the computer-program mechanism further includes instructions for converting a document that includes an edge-based representation of the target pattern into the target pattern.

9. The computer-program product of claim 1, wherein the function depends, at least in part, on a model of the photolithographic process, wherein the model includes a resist model.

10. The computer-program product of claim 1, wherein the generating involves:
  modifying a first representation of the first mask pattern to produce a second representation of the second mask pattern in accordance with the gradient; and
  extracting a second mask pattern from the second representation.

11. The computer-program product of claim 10, wherein the second mask pattern is piece-wise rectilinear.

12. The computer-program product of claim 10, wherein the first representation is a distance function in which a value of the first representation corresponds to a distance from a nearest contour in a plane of the first mask pattern.

13. The computer-program product of claim 12, wherein the first representation has a pre-determined value on a contour in the plane.

14. The computer-program product of claim 13, wherein the computer-program mechanism further includes instructions for adjusting the second representation such that it is a distance function in which a value of the second representation corresponds to a distance from a nearest contour in a plane of the second mask pattern.

15. The computer-program product of claim 1, wherein the computer-program mechanism further includes instructions for combining the second mask pattern with a third mask pattern, wherein the third mask pattern is determined in accordance with pre-determined optical-proximity-correction rules.

16. The computer-program product of claim 1, wherein the function is a merit function that assigns different relative weights to different regions of the first mask pattern.

17. The computer-program product of claim 1, wherein the function is a merit function that includes estimate of a process window corresponding to the photolithographic process.

18. The computer-program product of claim 1, wherein the function is a merit function that includes a model of the photolithographic process that includes out-of-focus conditions.

19. The computer-program product of claim 1, wherein the function is a merit function that indicates a degree of desirability of the first mask pattern.

20. A computer system, comprising:
  at least one processor;
  at least one memory; and
  at least one program module, the program module stored in the memory and configured to be executed by the processor, wherein at least the program module is for determining a mask pattern to be used on a photo-mask in a photolithographic process, and wherein the photo-mask has a plurality of distinct types of regions having distinct optical properties, at least the program module including:
    instructions for providing a first mask pattern that includes a plurality of distinct types of regions corresponding to the distinct types of regions of the photo-mask;
    instructions for calculating a gradient of a function, wherein the function depends on the first mask pattern and an estimate of a wafer pattern that results from the photolithographic process utilizing at least a portion of the first mask pattern, and wherein the gradient is calculated in accordance with a formula obtained by taking a derivative of the function; and instructions for generating a second mask pattern based, at least in part, on the gradient of the function.

21. A computer system, comprising:

means for computing;

means for storing; and at least one program module mechanism, the program module mechanism stored in at least the means for storing and configured to be executed by at least the means for computing, wherein at least the program module is for determining a mask pattern to be used on a photo-mask in a photolithographic process, and wherein the photo-mask has a plurality of distinct types of regions having distinct optical properties, at least the program module including:

instructions for providing a first mask pattern that includes a plurality of distinct types of regions corresponding to the distinct types of regions of the photo-mask;

instructions for calculating a gradient of a function, wherein the function depends on the first mask pattern and an estimate of a wafer pattern that results from the photolithographic process utilizing at least a portion of the first mask pattern, and wherein the gradient is calculated in accordance with a formula obtained by taking a derivative of the function; and instructions for generating a second mask pattern based, at least in part, on the gradient of the function.

* * * * *